United States Patent [19]

Matsuoka et al.

[11] Patent Number: 5,044,810
[45] Date of Patent: Sep. 3, 1991

[54] IC SOCKET HAVING COVER WITH LOCKING MEMBER

[75] Inventors: Noriyuki Matsuoka; Yoshiyuki Kato; Kazumi Uratsuji, all of Tokyo, Japan

[73] Assignee: Yamaichi Electric Mfg. Co., Ltd., Tokyo, Japan

[21] Appl. No.: 390,815

[22] Filed: Aug. 7, 1989

[30] Foreign Application Priority Data

Aug. 5, 1988 [JP] Japan ............................... 63-103864

[51] Int. Cl.⁵ ............................................. F16C 11/04
[52] U.S. Cl. ..................... 403/93; 403/330; 292/128
[58] Field of Search ............... 403/325, 323, 330, 327, 403/92, 93, 321, 322, 328, 96, 95, 24; 292/128, 101, DIG 17

[56] References Cited

U.S. PATENT DOCUMENTS

| | | | |
|---|---|---|---|
| 2,559,473 | 7/1951 | Slodek, Sr. | 403/93 X |
| 3,735,701 | 5/1973 | Ackerman | 292/128 X |
| 3,760,333 | 9/1973 | Stieler | 292/101 X |
| 3,796,169 | 3/1974 | Bales et al. | 403/93 X |
| 3,804,355 | 4/1974 | Uroshevich | 403/93 X |
| 4,733,882 | 3/1988 | Kassai | 403/330 X |
| 4,893,850 | 1/1990 | Mizusawa | 292/128 |

FOREIGN PATENT DOCUMENTS 2356828  1/1978  France .................. 403/330

Primary Examiner—Peter M. Cuomo
Attorney, Agent, or Firm—Wenderoth, Lind & Ponack

[57] ABSTRACT

An IC socket has a socket substrate, an IC press cover pivotally attached to one end of the socket substrate through a shaft, and a lock member pivotally attached to the other end of the socket substrate through a shaft and adapted to engage with and disengage from a free end of the IC press cover. The improvement is characterized in that one end of the socket substrate is formed with a lock member pivot hole for inserting therein the shaft for the lock member adjacent to a press cover pivot hole for inserting therein the shaft for the IC press cover, and the other end of the socket substrate is formed with a press cover pivot hole for inserting therein the shaft for the IC press cover adjacent to a lock member pivot hole for inserting therein the shaft for the lock member. The two pivot holes formed in the above-mentioned one end of the socket substrate are arranged symmetrically with the two pivot holes formed in the other end of the socket substrate.

7 Claims, 4 Drawing Sheets

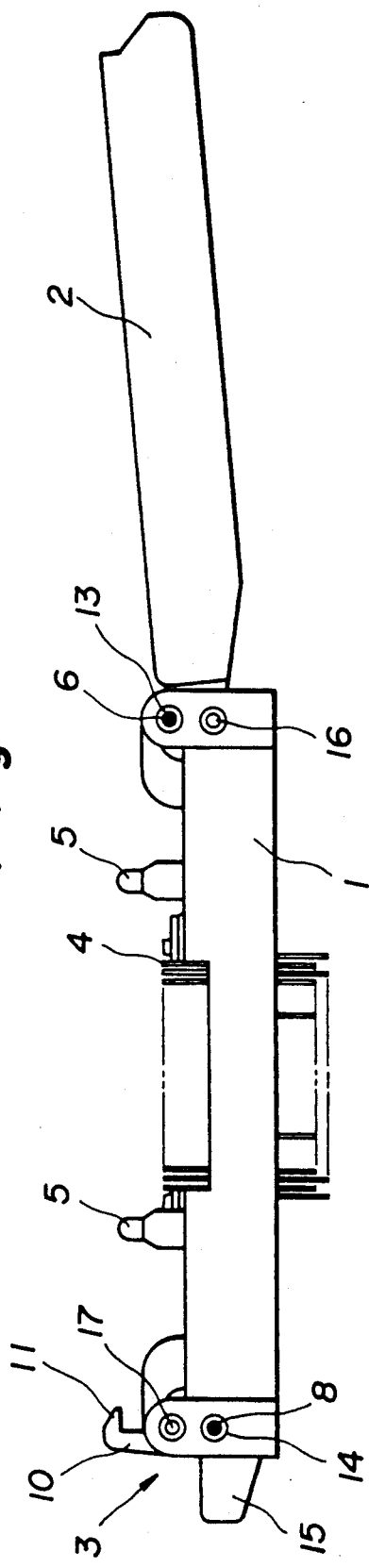
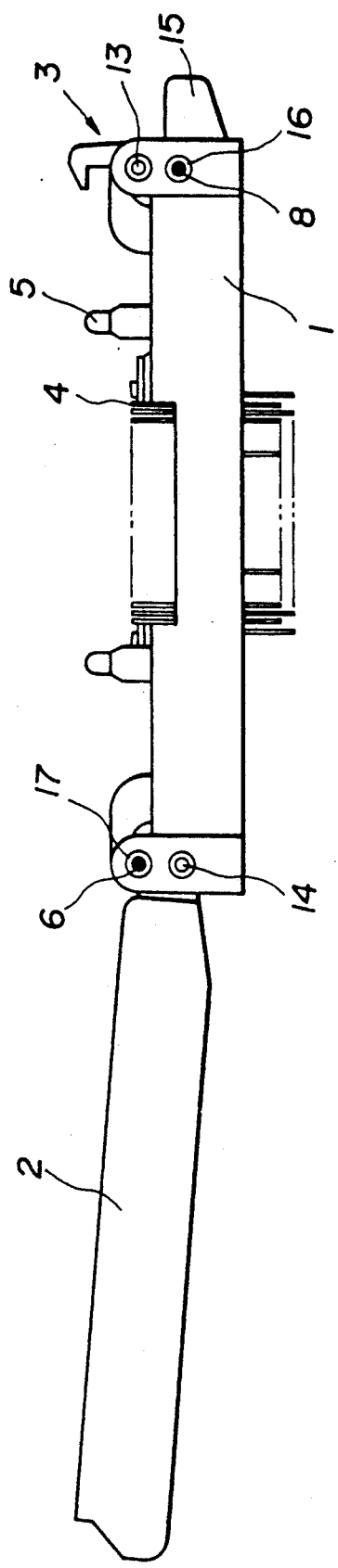

IC SOCKET HAVING COVER WITH LOCKING MEMBER

FIELD OF THE INVENTION

This invention relates to an IC socket including an IC press cover for closing upon a socket substrate and a lock member for maintaining the IC press cover in a closed state.

DESCRIPTION OF THE PRIOR ART

In an IC socket comprising a socket substrate with IC loaded thereon and in which contact is maintained by exerting a downward force to the IC, the socket substrate is provided with an IC press cover pivotally attached to one end of the socket substrate through a shaft and a lock member pivotally attached to the other end of the socket substrate through a shaft, the lock member being engaged with one end portion of the IC press cover when it is closed upon the socket substrate to maintain a closed state thereof so as to obtain the above-mentioned contact pressure. The lock member can be unlocked in order to release the IC press cover in order to facilitate an easy loading and unloading of the IC.

In the above-mentioned IC socket, in a case in which a number of IC sockets are mounted on a distributing board, when the IC press cover is opened, this IC press cover having a large dimension superposes upon an IC socket on the adjacent row. In order to avoid this, spaces between the adjacent rows of IC sockets must be made large enough so that opening of one IC press cover would not interfere an IC socket on the adjacent row. As a result, density of arrangement of IC sockets is lowered. This inconvenience is particularly significant, when, for example, an in-burn test is carried out wherein a large amount of IC measurement is effected at a time. In that case, accommodating capacity in a constant temperature furnace is lowered and measuring efficiency is deteriorated.

Also, in a case in which IC sockets are arranged in parallel relation on a distributing board in such a manner that lock members are faced with each other, in order to cope with the above-mentioned problems, the facing directions of the IC are reversed. Therefore, it is required to arrange the facing direction of the IC of one row differently by 180° with respect to the facing direction of the IC of the adjacent row, because otherwise it is difficult to obtain a correct alignment between the IC and a positioning pin of an IC socket. It is very troublesome to check which direction the IC faces and to check the positioning hole each time. Also, in a case where the IC is carried on a film-like frame, there is a fear of breakage of the IC because it is difficult to insert the IC into the positioning pin while confirming the direction of the IC. In order to solve the above two problems, it is necessary to prepare two kinds of IC sockets in which the IC press cover and the lock lever are mounted in the opposite way. This incurs an additional burden to the user.

SUMMARY OF THE INVENTION

The present invention aims at providing an IC socket capable of solving the above-mentioned problems.

In order to solve the above-mentioned problems, there is essentially provided an IC socket including a socket substrate, an IC press cover pivotally attached to one end of said socket substrate through a shaft, and a lock member pivotally attached to the other end of said socket substrate through a shaft and adapted to engage with and disengage from a free end of said IC press cover, the improvement being characterized in that one end of said socket substrate is formed with a lock member pivot hole for inserting therein the shaft for said lock member adjacent to a press cover pivot hole for inserting therein the shaft for said IC press cover, and the other end of said socket substrate is formed with a press cover pivot hole for inserting therein the shaft for said IC press cover adjacent to a lock member pivot hole for inserting therein the shaft for said lock member, said two pivot holes formed in said one end of said socket substrate being arranged symmetrical with said two pivot holes formed in the other end of said socket substrate.

With the above-mentioned construction of the present invention, the IC press cover pivotably supported by one end of the socket substrate can be pivotably supported by the other end of the socket substrate through the press cover pivot hole formed in said other end, and in the same manner, the lock member pivotably supported by the other end of the socket substrate can be pivotably supported by said one end of the socket substrate through the lock member pivot hole formed in said one end of the socket substrate. By virtue of the foregoing arrangement, the IC press cover and the lock member mounted on both ends of the socket can be mounted on the other ends of the socket substrate, respectively. Accordingly, in a case where the IC sockets are arranged in parallel relation on the distributing board, the socket substrate as an IC socket body provided with the positioning pins is not required to be changed in the facing direction. Instead, the IC press cover and the lock member may simply be mounted opposite each other. In this way, the density of arrangement of the socket substrates can be intensified.

Furthermore, even if the socket substrates are arranged in such a manner that the lock members are placed opposite each other, the facing direction of the socket substrates remains unchanged. Therefore, the IC, which has been prepared beforehand, can be mounted on the IC sockets arranged in several rows always in the same facing direction and posture. Therefore, breakage of the IC caused by a user's misunderstanding of the mounting posture of such an IC can be prevented.

In addition, one kind of IC socket can be used by adequately remounting the IC press cover and the lock member in the opposite way depending on the circumstances. Therefore, the waste created by having to prepare two kinds of IC sockets can be avoided.

The above and other objects and advantages of the present invention will be more readily apparent to those skilled in the art from a reading of the following detailed description in conjunction with the accompanying drawings which show one preferred embodiment of the invention for illustration purposes only, but not for limiting the scope of the invention in any way.

BRIEF DESCRIPTION OF THE DRAWINGS

FIG. 1 is a side view of the IC socket showing one embodiment of the present invention;

FIG. 2 is a side view of the IC socket but with the lock member and the IC press cover mounted in the opposite way;

DETAILED DESCRIPTION OF THE INVENTION

Figure 3:
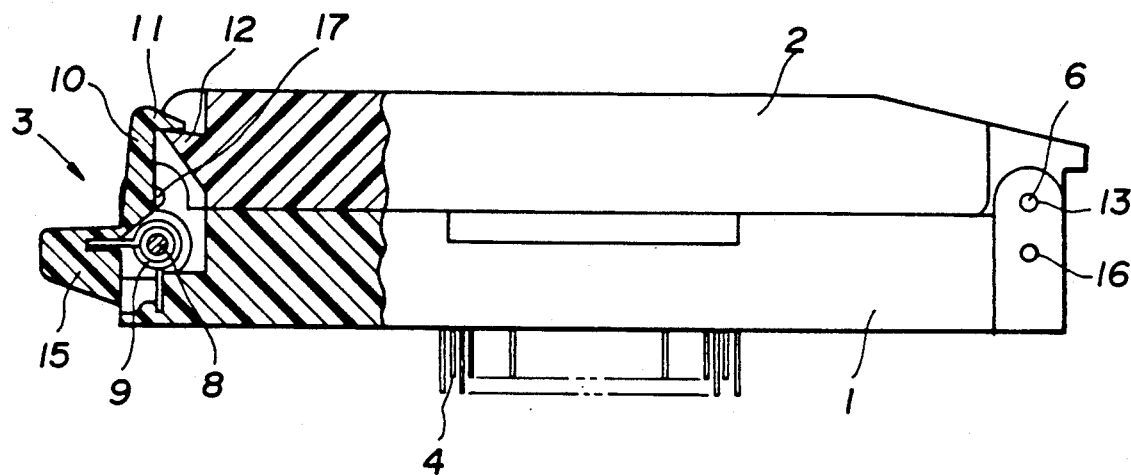
FIG. 3 is a side view, partly in section, showing a closed state of the IC press cover.
Figure 4:
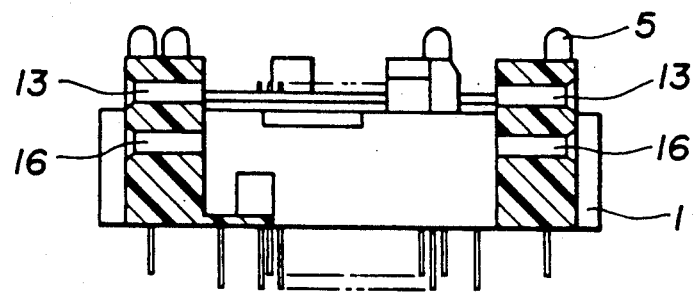
FIG. 4 is a rear view of the IC socket, wherein a portion formed with pivot holes is shown in section.
Figure 5:
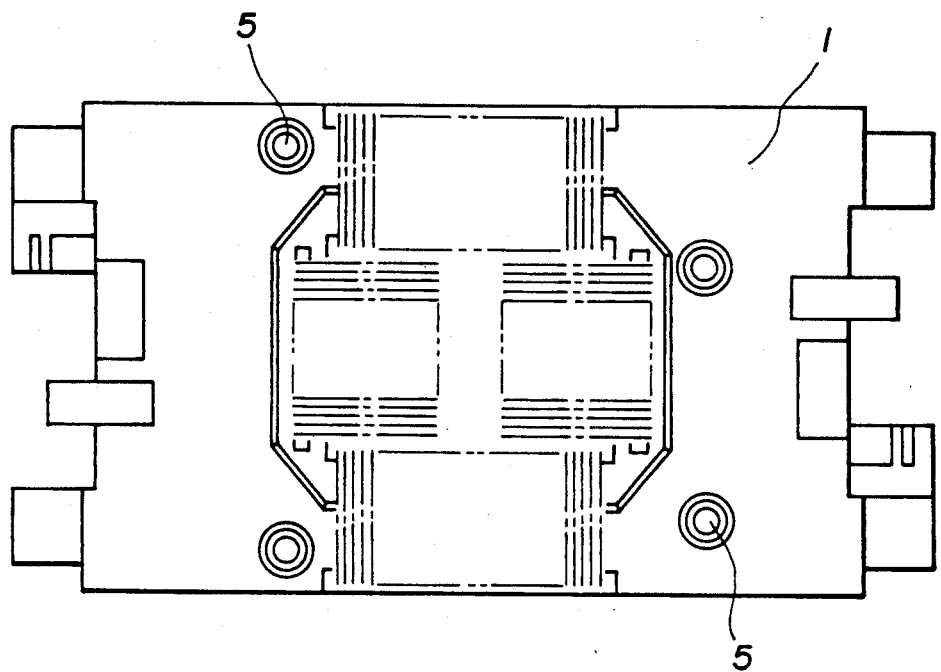
FIG. 5 is a plan view of the socket substrate.
Figure 6:
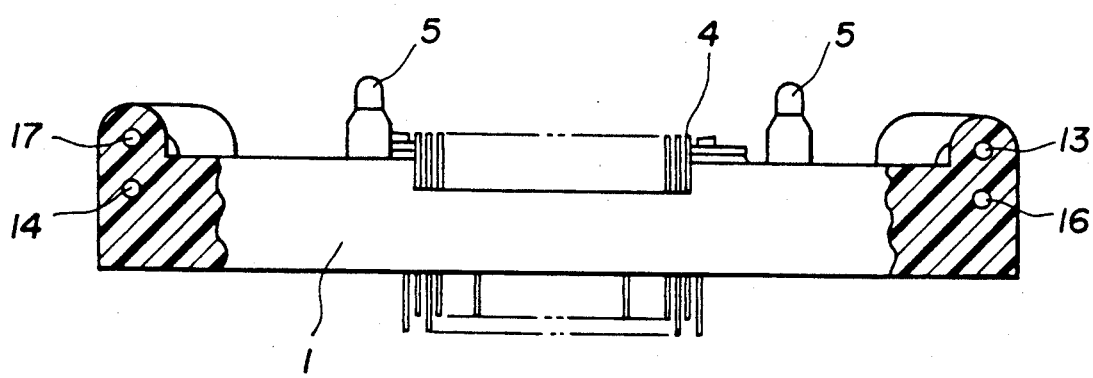
FIG. 6 is a side view of the socket substrate, wherein a portion formed with pivot holes is shown in section.

The embodiment of the present invention will be described hereunder with reference to FIGS. 1-7 of the accompanying drawings.

Reference number 1 denotes a socket substrate, 2 an IC press cover axially supported by one end of the socket substrate 1, and 3 a lock member axially supported by the other end of the socket substrate 1.

The socket substrate 1 is provided with a number of contacts 4 arranged at the side of its central upper surface and a plurality of positioning pins (contact pins) 5 extending upwardly from the periphery of the area where the contacts are arranged. While inserting the positioning pins 5 into the corresponding positioning holes (not shown in FIG. 1) formed in an IC, the IC is placed on and in contact with the contacts. Each of the contact pins is formed of a two-step shaft having a small diameter portion at one end and a large diameter portion at the other end. By virtue of the foregoing structure of the contact pins, the small diameter shaft portion thereof facilitates easy insertion and removal of the IC, while the large diameter shaft portion thereof serves to obtain correct alignment with the positioning hole of the IC. As a result, the IC and the contact can correctly be positioned to ensure a reliable contact relation therebetween.

The socket substrate 1 is provided with the IC press cover 2 pivotally supported by one end of the socket substrate 1 through a shaft 6, and the IC press cover 2 is normally resiliently supported in the releasing direction by a spring 7 (see FIG. 7) which is disposed at the shaft portion. By closing the IC press cover 2 onto the socket substrate against the force of the spring 7, the IC (IC body or contacting piece) is pushed to obtain a resilient contact relation with the contacts.

Figure 7:
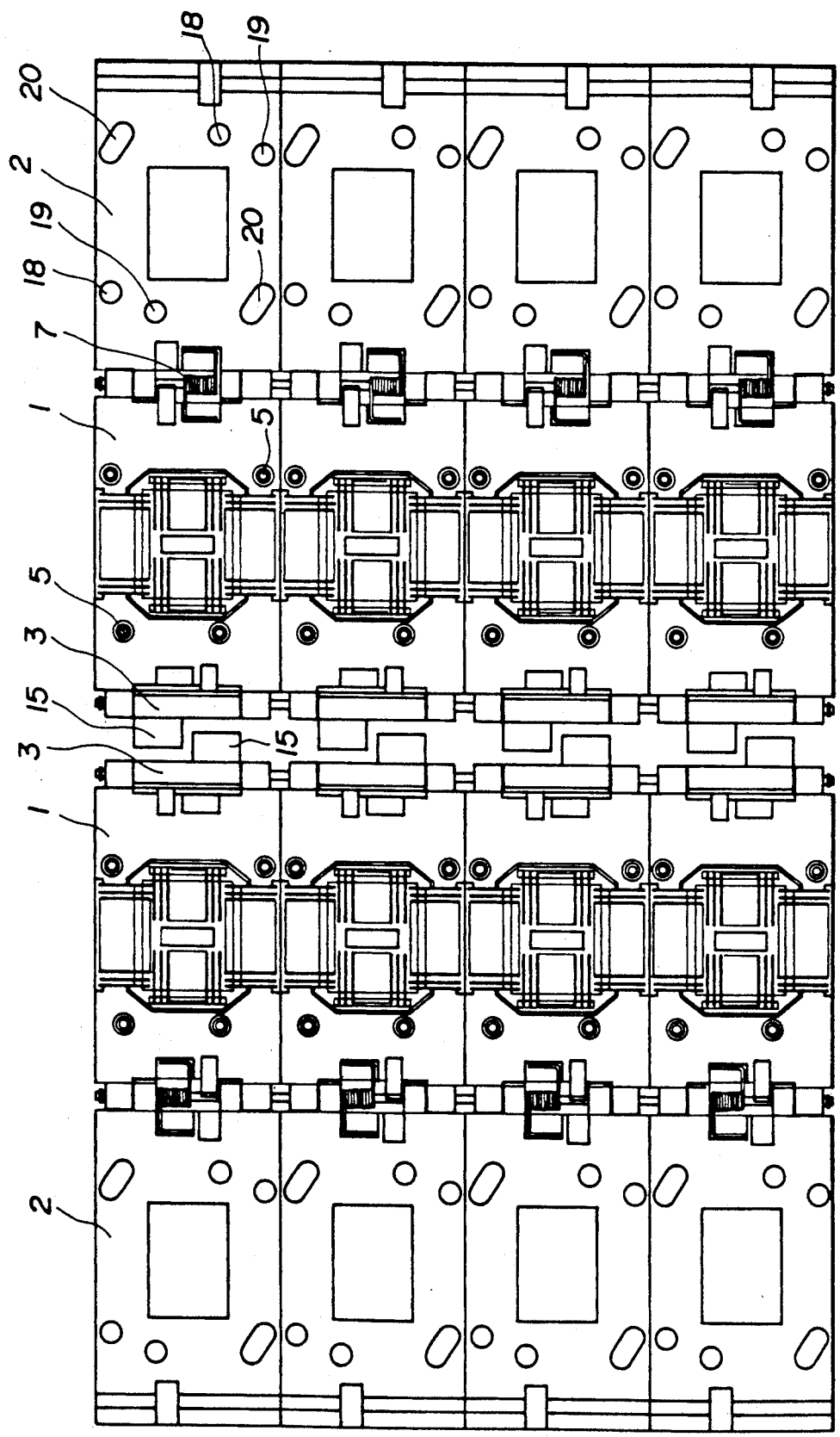
FIG. 7 is a plan view showing an IC socket group arranged in parallel relation on a distributing board.

As shown in FIG. 7, the IC press cover 2 is formed with a pair of pin holes 18 for inserting therein the positioning pins 5 when the IC press cover 2 is pivotably supported by one end of the socket substrate 1, and a pair of pin holes 19 for inserting therein the positioning pins 5 when the cover 2 is pivotably supported by the other end of the socket substrate 1. The press cover 2 is also provided with a pair of pin holes 20 which serve as common holes when the cover 2 is pivotably supported by either end of the socket substrate 1. These holes 18, 19 and 20 are through holes formed all the way through the IC press cover 2. In this case, the common hole 20 is a long hole inclined at an angle of 45°.

Numeral 13 denotes a press cover pivot hole for inserting therein the shaft 6 through which the IC press cover 2 is supported by one end of the socket substrate 1.

On the other hand, the socket substrate 1 is provided with the lock member 3 pivotally supported on the other end of the socket substrate 1 through a shaft 8, and the lock member 3 is resiliently supported by a spring 9 mounted on a shaft portion in such a manner that the lock member 3 is normally biased toward the engaging direction by the spring 9. Due to the foregoing arrangement, the lock member 3 is brought into engagement with the end portion of the IC press cover 2 by means of pivotal movement of the lock member 3 in one direction in accordance with the resiliently supporting force of the spring 9, whereas the lock member 3 is disengaged from the IC press cover 2 by means of pivotal movement of the lock member 3 in the other direction against the bias force of the spring 9. Numeral 14 denotes a lock member pivot hole for inserting therein the shaft 8 so that the lock member 3 is axially supported by the other end of the socket substrate 1 through the shaft 8.

The lock member 3 is provided with a hook portion 10 erected along the end portion of the socket substrate 1, and the hook portion 10 is provided with a retaining claw 11 projecting from the side of a front surface of a free end of the hook portion 10. On the other hand, the IC press cover 2 is provided with a retaining step portion 12 at its edge portion, the retaining step portion 12 being engaged with the retaining claw 11 to maintain the closed state of the IC press cover 2. The lock member 3 is also provided with a push-down operating portion 15 projecting downward behind the hook portion 10 from a shaft supporting portion of the lock member 3. The push-down operating portion 15 is arranged in such a manner as to project backward from an end face of the socket substrate 1.

Owing to the above-mentioned arrangement, the pushdown operating portion 15 and the hook portion 10 form a generally L-shaped lever which is pivotable about the shaft 8. The push-down operating portion 15, as described previously, projects backward of the end face of the socket substrate 1. In this case, the push-down operating portion 15, as shown in FIG. 7, is disposed in a position displaced in the right-hand direction or in the left-hand direction from a center line perpendicular to the pivot axis of the lock member 3. Owing to the foregoing arrangement, as shown in FIG. 7, when a number of IC sockets are arranged in parallel relation on a distributing board, the push-down operating portions 15 of the lock members 3 of the IC sockets arranged in respective rows are arranged in rows behind the end face of the socket substrate 1. The push-down operating portions 15 of the IC sockets on adjacent rows are arranged such that operating portions 15 of one row alternate in position with operating portions 15 of the adjacent row. By virtue of the foregoing arrangement, when a robot arm is lowered in the vertical direction behind the end face of the socket substrate 1, the group of the push-down operating portions 15 are collectively pivoted backward in order to release the engagement.

One end of such constructed socket substrate 1 is formed with a lock member pivot hole 16 for pivotably supporting the lock member 3 adjacent to the press cover pivot hole 13 for pivotably supporting the IC press cover 2. The other end of the socket substrate 1 is formed with a shaft inserting hole 17 for the IC press cover 2 adjacent to the lock member pivot hole 14 for pivotably supporting the lock member 3.

Press cover pivot hole 13 for pivotably supporting the IC press cover 2 and the lock member pivot hole 16 for pivotably supporting the lock member 3 are provided at one end of the socket substrate 1, and the lock member pivot hole 14 for pivotably supporting the lock member 3 and press cover pivot hole 17 for pivotably supporting the IC press cover 2 are provided at the other end of the substrate 1. The holes 13 and 16 are symmetrical with respect to the holes 17 and 14.

Preferably, the holes 13 and 17 of the IC press cover 2 at opposing ends of the socket substrate 1 are arranged in parallel vertically aligned with the holes 14 and 16 for the lock member 3. The shaft holes 13 and 17 for receiving the press cover pivot shaft 6 are arranged vertically below the holes 16 and 14 for receiving the lock member pivot shaft 8.

By virtue of the arrangement of the various pivot holes 13 and 16, and 14 and 17, as shown in FIGS. 1 and 2, the IC press cover 2 can be pivotably supported by the shaft 6 inserted either through the hole 13 at one end of the substrate 1 or through hole 17 formed at the other end of the substrate 1. Similarly, the lock member 3 which is to be pivotably supported at the end of the socket substrate 1 opposite the end which supports the press cover 2, can be pivotably supported by the shaft 8 inserted either through the hole 16 formed in one end of the substrate 1 or through the shaft inserting hole 14 at the opposite end of the substrate 1. In this way, by using the same socket substrate 1, the IC press cover 2 and the lock member 3 can be reversed in mounting position when in use.

As described in the foregoing, according to the present invention, by properly selecting one of the pivot holes which are formed in opposing ends of the socket substrate, the IC press cover can be pivotably supported by one or the other end thereof. Similarly, by properly selecting one of the shaft inserting holes formed in opposing ends of the socket substrate, the lock member can pivotably be supported by whichever end of the substrate 1 is not supporting the press cover 2. In this way, the IC press cover and the lock member which are to be attached to both ends of the socket substrate can be attached in either of two opposite arrangements, so as to correspond with the mounting state needed for the IC socket onto the distributing board. Therefore, when the IC sockets are arranged in parallel relation on the distributing board, only the IC press cover and the lock member need be reversed. That is, it is not necessary to change the direction of the socket substrate as an IC socket body which includes a plurality of positioning pins in order to reverse the position of the lock members. In this way, density for arranging the IC substrates can be intensified.

Furthermore, even if the socket substrates are arranged in parallel relation such that the lock members are placed in opposite relation to each other, the facing direction of the socket substrates remains unchanged. Therefore, ICs which were prepared beforehand can be mounted on the IC sockets on each row in such a manner that the ICs always face the same direction and keep the same posture. As a result, the IC can be loaded and unloaded rapidly. Moreover, breakage of the IC caused by a user's misunderstanding of the loading posture of the IC can effectively be prevented.

In addition, by using one kind of IC socket, the IC press cover and the lock member can be reversed in mounting when in use in accordance with the actual mounting state. Therefore, the waste created by having to prepare two kinds of IC sockets can be avoided.

Having thus described the preferred embodiment of the present invention, it should be understood that numerous structural modifications and adaptations may be resorted to without departing from the spirit of the invention.

What is claimed is:

1. An IC socket comprising:
    a socket substrate having first and second opposing ends, a horizontal upper face, first and second vertical side faces, first and second press cover pivot holes (13, 17) formed horizontally through said first and second ends, respectively, and first and second lock member pivot holes (16, 14) formed horizontally through said first and second ends, respectively, said first and second press cover pivot holes (13, 17) being aligned vertically with said first and second lock member pivot holes (16, 14), respectively;
    a press cover pivot shaft selectively removably inserted through one of said first and second press cover pivot holes (13, 17);
    a lock member pivot shaft selectively removably inserted through the one of said first and second lock member pivot holes (16, 14) formed through the one of said first and second ends opposite to the one of said first and second ends through which said press cover pivot shaft is inserted;
    a press cover pivotably mounted about said press cover pivot shaft for movement between a closed position in which said press cover is in overlying relation to said socket substrate and an open position; and
    a lock member pivotably mounted about said lock member pivot shaft for movement between a locking position in which said lock member can lock said press cover in said closed position, and an unlocking position.

2. An IC socket as recited in claim 1, wherein
    each of said first and second press cover pivot holes and said first and second lock member pivot holes extend through both of said first and second vertical side faces.

3. An IC socket as recited in claim 1, wherein
    said first and second press cover pivot holes are aligned above said first and second lock member pivot holes, respectively.

4. An IC socket as recited in claim 1, wherein
    said lock member includes a hook shaped claw portion; and
    said press cover includes a retaining portion for engagement with said claw portion when said press cover is in said closed position and said lock member is in said locking position.

5. An IC socket as recited in claim 4, further comprising
    means for biasing said lock member toward its locking position.

6. An IC socket as recited in claim 5, wherein
    said lock member also includes a push-down operating portion extending away from said socket substrate for causing said lock member to pivot toward said unlocking position when a downward force is applied to said operating portion.

7. An IC socket as recited in claim 6, wherein
    said operating portion of said lock member is offset laterally from a lateral center of said socket substrate.

* * * * *